(12) United States Patent
Sumida et al.

(10) Patent No.: US 7,359,230 B2
(45) Date of Patent: Apr. 15, 2008

(54) NONVOLATILE MEMORY DEVICE

(75) Inventors: Takayuki Sumida, Kodama-gun (JP); Tadahiko Hirai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 313 days.

(21) Appl. No.: 10/546,216

(22) PCT Filed: Dec. 6, 2004

(86) PCT No.: PCT/JP2004/018522

§ 371 (c)(1),
(2), (4) Date: Aug. 18, 2005

(87) PCT Pub. No.: WO2005/060001

PCT Pub. Date: Jun. 30, 2005

(65) Prior Publication Data

US 2006/0157772 A1  Jul. 20, 2006

(30) Foreign Application Priority Data

Dec. 18, 2003 (JP) ............................. 2003-421309

(51) Int. Cl.
*G11C 11/00* (2006.01)
(52) U.S. Cl. .................. 365/148; 365/100; 365/104
(58) Field of Classification Search ................ 365/148, 365/100, 104

See application file for complete search history.

(56) References Cited

U.S. PATENT DOCUMENTS 5,119,329 A * 6/1992 Evans et al. ................ 365/145
5,625,219 A   4/1997 Takagi ........................ 257/530
6,034,882 A   3/2000 Johnson et al. ............. 365/103
6,385,407 B1  5/2002 Inose .......................... 399/24
6,587,370 B2  7/2003 Hirai ........................... 365/171
6,703,676 B2  3/2004 Hirai et al. .................. 257/421
6,724,651 B2  4/2004 Hirai ........................... 365/158
6,888,773 B2* 5/2005 Morimoto ................... 365/218
2001/0045593 A1 11/2001 De Leeuw et al. ......... 257/314

FOREIGN PATENT DOCUMENTS

| CN | 1381071 | 11/2002 |
| JP | 6-302775 | 10/1994 |
| JP | 7-176703 | 7/1995 |
| JP | 2000-246921 | 9/2000 |

(Continued)

OTHER PUBLICATIONS

M. Mushrush, et al., "Easily Processable Phenylene-Thiophene-Based Organic Field-Effect Transistors and Solution-Fabricated Nonvolatile Transistor Memory Elements", Journal Of American Chemical Society, 2003, vol. 125, pp. 9414-9423.

*Primary Examiner*—Pho M. Luu
(74) *Attorney, Agent, or Firm*—Fitzpatrick, Cella, Harper & Scinto

(57) ABSTRACT

Provided is a nonvolatile memory device including: a storage element; a switching element electrically connected to the storage element; and a plurality of lead wirings electrically connected to the switching element, all of which are arranged on a substrate having an insulating surface, wherein the switching element includes an organic semiconductor, and the storage element contains a dielectric material and stores information by selecting at least two states including a high impedance state and a low impedance state.

10 Claims, 9 Drawing Sheets

FOREIGN PATENT DOCUMENTS

| | | |
|---|---|---|
| JP | 2001-189431 | 10/2001 |
| JP | 2003-529223 | 9/2003 |
| KR | 0157673 | 7/1998 |
| KR | 2002-0030272 | 4/2002 |
| WO | WO 95/17009 | 6/1995 |
| WO | WO 01/73845 | 10/2001 |

* cited by examiner

NONVOLATILE MEMORY DEVICE

TECHNICAL FIELD

The present invention relates to a nonvolatile memory device including a matrix wiring, a switching element, and a storage element.

BACKGROUND ART

In recent years, electronic devices exploiting organic semiconductor materials have been developed widely, and many reports have been made on the development of an organic electro-luminescence (EL) and an organic thin film transistor (TFT), an organic semiconductor laser, and the like.

Of those, the organic TFT, a kind of organic transistors, does not require a high temperature process during its fabrication, and therefore is promising as a technique with which integrated circuits can be constructed on an inexpensive substrate made of glass, resin, or the like at a low cost by employing a printing technique or the like.

Meanwhile, a semiconductor integrated circuit of a nonvolatile memory, which retains information even after its electric power source is turned off, has been generally composed of a system formed by using single crystalline silicon. However, in recent years, elements and circuits exploiting noncrystalline silicon such as amorphous silicon or polycrystalline silicon or utilizing a non-silicon-based semiconductor such as an organic semiconductor or a diamond or silicon carbide semiconductor are rapidly developed.

For example, U.S. Pat. No. 6,034,882 discloses a configuration in which an impedance is varied by applying to the storage element a write voltage inducing the breakdown of a dielectric contained in a storage element, whereby a memory effect is attained.

If such a memory device is fabricated by using the above-mentioned organic semiconductor element, the fabrication is expected to be at a low cost. However, memory configurations having functions comparative with those of a flash memory and an electrical erasable programmable read only memory (EEPROM) made of single-crystalline silicon are not disclosed in the present circumstances.

Further, for example, there is proposed a configuration using a phenomenon in which a current exhibits a binary state at a certain read voltage due to a threshold voltage shift of an organic transistor as described in Journal of American Chemical Society, 2003, vol. 125, pp. 9414-9423. However, an applied voltage and its time period necessary for inducing a sufficient threshold voltage shift for achieving this binary state are 100 V and 1 minute, respectively, and this is difficult in practical use.

Moreover, Japanese Patent Application Laid-Open No. 2001-189431 discloses a configuration capable of carrying out multi-valued storage by using an organic material for a storage element and fluctuating an impedance of the element with a voltage.

DISCLOSURE OF THE INVENTION

The present invention has been made to solve a problem concerning a configuration of the conventional techniques in that it is difficult to construct a nonvolatile memory device capable of selecting a desired cell, on a substrate having an insulating surface made of glass, resin, or the like, in particular, on a substrate which is inexpensive but in turn cannot bear a high temperature process. It is therefore an object of the present invention to provide a nonvolatile memory device enabling a construction of an integrated circuit on an inexpensive substrate such as a glass or resin substrate and allowing selection of a desired cell, by adopting an element configuration in which an organic material is used for a switching element and a storage element includes a dielectric.

That is, a nonvolatile memory device according to the present invention includes: a storage element; a switching element electrically connected to the storage element; and a plurality of lead wirings electrically connected to the switching element or the storage element, all of which are arranged on a substrate having an insulating surface, in which the switching element includes an organic semiconductor, and the storage element contains a dielectric material and stores information by selecting at least two states including a high impedance state and a low impedance state.

According to the configuration of the present invention, there is provided a mechanism capable of selecting a desired cell by the switching element which includes the organic semiconductor, and further it is possible to construct the nonvolatile memory device which has a sufficiently large current ratio between two states including "0" and "1" of a memory element, on an inexpensive substrate having an insulating surface made of glass, resin, or the like, by using a printing method.

BEST MODE FOR CARRYING OUT THE INVENTION

Figure 1:
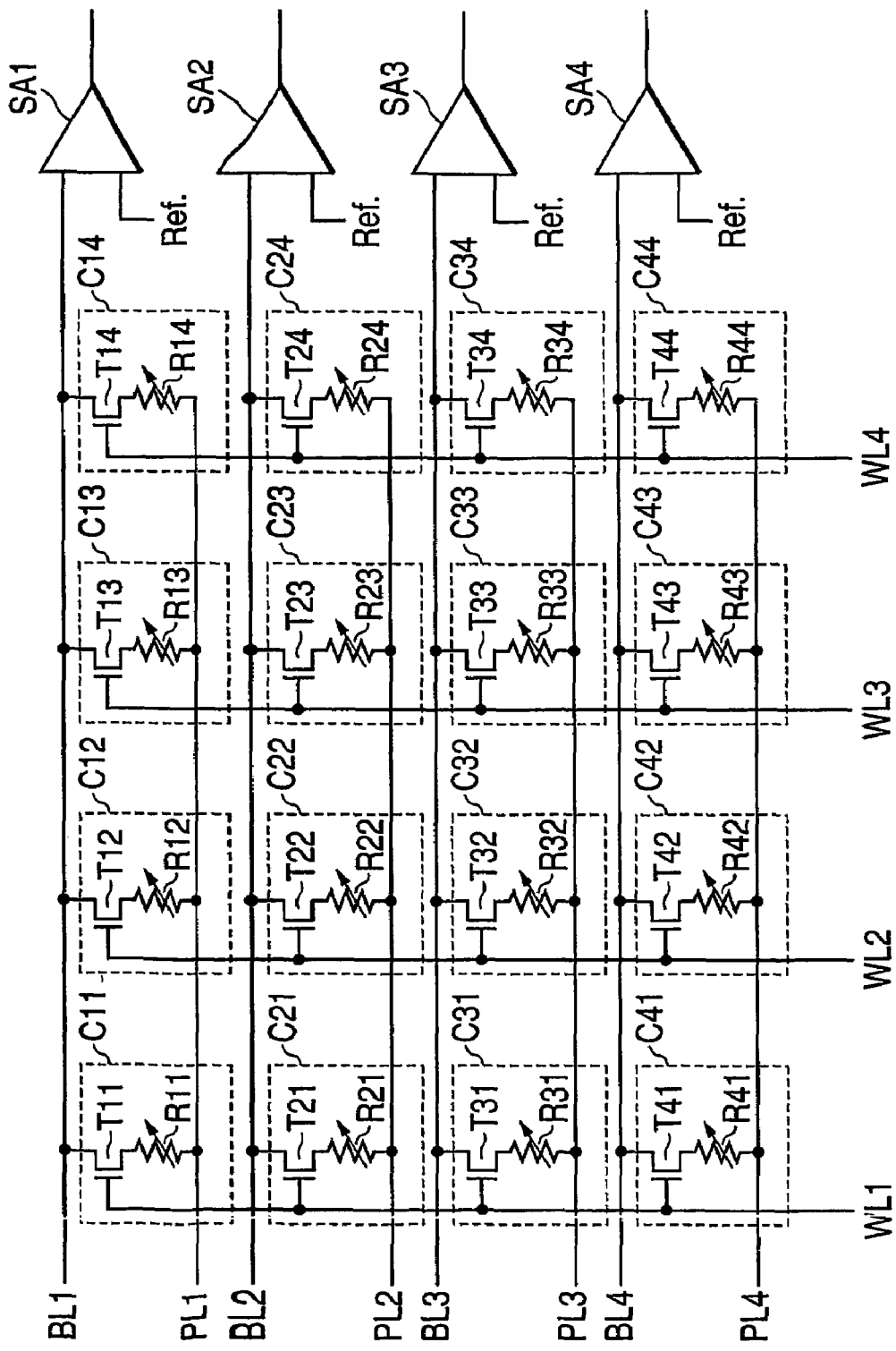
FIG. 1 is a circuit diagram illustrating a circuit configuration.

A nonvolatile memory device according to the present invention includes a storage element having a changeable impedance, in which a switching element includes an organic semiconductor and the storage element includes a dielectric. Herein, the basic operation of the nonvolatile memory device is to vary an impedance of the memory element at a read voltage when a write voltage higher than the read voltage is applied to the dielectric in the memory element.

In particular, it is preferable that breakdown occur in the dielectric of the memory element when a write voltage higher than the read voltage is applied to the dielectric, and the impedance of the memory element irreversibly decrease in the read voltage. According to this, information once written becomes non-rewritable, which is not only preferable in the viewpoint of security, but also allows use of a simple drive method in comparison with EEPROMs.

The switching element is preferably a transistor including an organic semiconductor. This makes it possible to construct a memory array on a glass or resin substrate which is hardly used in a TFT made of an inorganic semiconductor such as silicon and formed via a high temperature process or an etching process. Accordingly, selection of a desired memory cell becomes enabled. As the transistor, there are a field effect type transistor, a thin film type transistor, a junction type transistor, and so forth, but any of those is usable. The organic semiconductor includes a material of which Fermi level is present within its band gap and which has semiconductor properties.

It is particularly preferable that breakdown of the dielectric in the memory element be induced at an applied voltage of 48 V or lower. This makes it possible to carry out low voltage drive necessary upon installation in a weak current system.

Moreover, when the weak current system is adopted, repeating of a read operation and a write operation can be coped with, and it is possible to suppress lowering of its current ratio.

The switching element may be a diode including an organic semiconductor. In this case, a memory device having a relatively simple matrix structure can be fabricated.

The nonvolatile memory device according to the present invention includes a plurality of lead wirings electrically connected to the switching element or the storage element. The lead wirings have a matrix structure, and in particular the configuration preferably includes plate lines in addition to bit lines and word lines, in which one terminal of a transistor is connected to one of the bit lines, another terminal of the transistor is connected to one of the word lines, and still another terminal of the transistor is connected to one of the plate lines via the memory element. When the plate lines are set to a ground potential, the operation becomes simple. Further, a potential other than the ground potential may be set so as to adjust the voltage applied to the storage element.

The nonvolatile memory device according to the present invention does not require fabrication involving an etching process with the substrate made of single-crystalline silicon. The satisfactory element can be formed by using a substrate having an insulating surface. In particular, it is preferable to use an inexpensive substrate made of resin or glass.

More preferably, the nonvolatile memory device is formed on a resin substrate. This makes it possible to utilize the nonvolatile memory device for an IC card or an IC tag. Also, a flexible material such as polyimide is exploitable.

An electric power source for such an IC card or IC tag may be a power source which externally supplies electricity to a non-built-in-type IC card or IC tag, or a battery built in a battery-built-type IC card or IC tag, and its voltage is preferably equal to or higher than the breakdown voltage of the dielectric. The above IC card or IC tag may be used as a nonvolatile memory device in association with a commuter pass, an identification card, or a package delivery, or may be attached to a cartridge for an electrophotographic image forming apparatus such as a laser beam printer or a copying machine (namely, a photosensitive drum or means for containing toner) or attached to a cartridge which contains ink for an ink jet printer using a piezoelectric system or a Bubble Jet® system. Such a case is preferable because various pieces of information or a large quantity of information can be stored before product shipment or at the time of product use. In addition, it is possible to use glass as well for the substrate.

Hereinafter, embodiments of the present invention are described with reference to the drawings.

First, the configuration of the nonvolatile memory device according to this embodiment as shown in FIG. 1 will be described.

FIG. 1 shows a configuration of a 16-bit memory device including bit lines BL1 to BL4; word lines WL1 to WL4 intersecting with the bit lines; and unit cells C11 to C44, wherein each unit cell includes one of organic thin film transistors (TFTS) T11 to T44 arranged in matrix as the switching elements containing an organic semiconductor, and one of memory elements R11 to R44 as the storage elements. Each gate electrode of the organic TFTs T11 to T44 is connected to a word line, each drain electrode is connected to a bit line, and each source electrode is connected to one terminal of one of the memory elements R11 to R44 where the other terminal thereof is connected to one of the plate lines PL1 to PL4.

The memory element configuration is a configuration in which a dielectric material is interposed between the electrodes. An arrangement example of the dielectric includes formation of a dielectric thin film through a sputtering method etc., or application of a liquid material such as spin on glass between the electrodes before being dried. Specific examples of the dielectric include: an inorganic dielectric such as alumina, tantalum oxide, or silicon oxide; a spin on glass material such as silsesquioxane; a polymeric material such as polymethylmethacrylate, polystyrene, or polyimide; and an organic dielectric such as a self-assembled molecule having a long-chain alkyl skeleton.

Characteristics of a cell including a polyimide substrate as the resin substrate and a dielectric interposed between two electrodes made of copper and silver in a sandwiching manner will be described below as a specific example of an embodiment of the storage element. In this example, the dielectric is composed of an alumina thin film having satisfactory insulating characteristics, which has been formed by a sputtering method under a room temperature condition.

Figure 2:
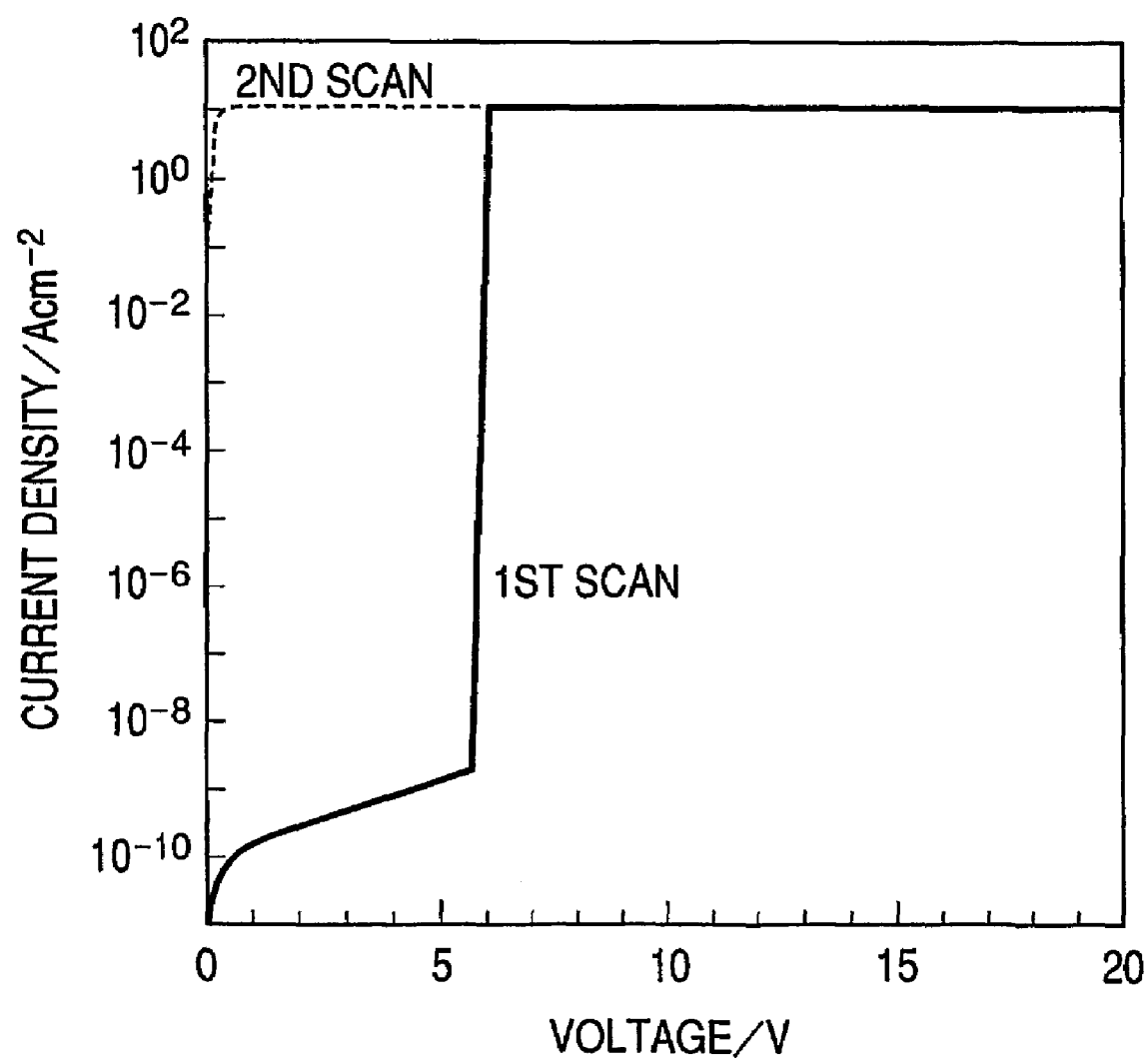
FIG. 2 is a graph showing current density/voltage characteristics of a memory element.

FIG. 2 is a graph of plotting applied voltage versus changed current with respect to the alumina thin film having a thickness of 14 nm interposed between the two electrodes made of copper and silver, as an example. Sweeping of the voltage applied between the electrodes is performed from 0 V to 10 V, but characteristics resulting from the first sweeping varies from those resulting from the second sweeping significantly. In the first sweeping, breakdown occurs at an applied voltage of about 5 V, which leads to a low resistance state because the current amount increases on a large scale. In the second sweeping as well, this low resistance state continues. This resistance change is irreversible, and once the low resistance state is achieved, the state is not returned to a high resistance state. Therefore, when the read voltage is set to about 4 V in this memory element, the resistance values in the high resistance state and the low resistance state significantly differ by about ten orders of magnitude. That is, this indicates that the impedance irreversibly reduces in the configuration using the resin substrate.

Figure 3:
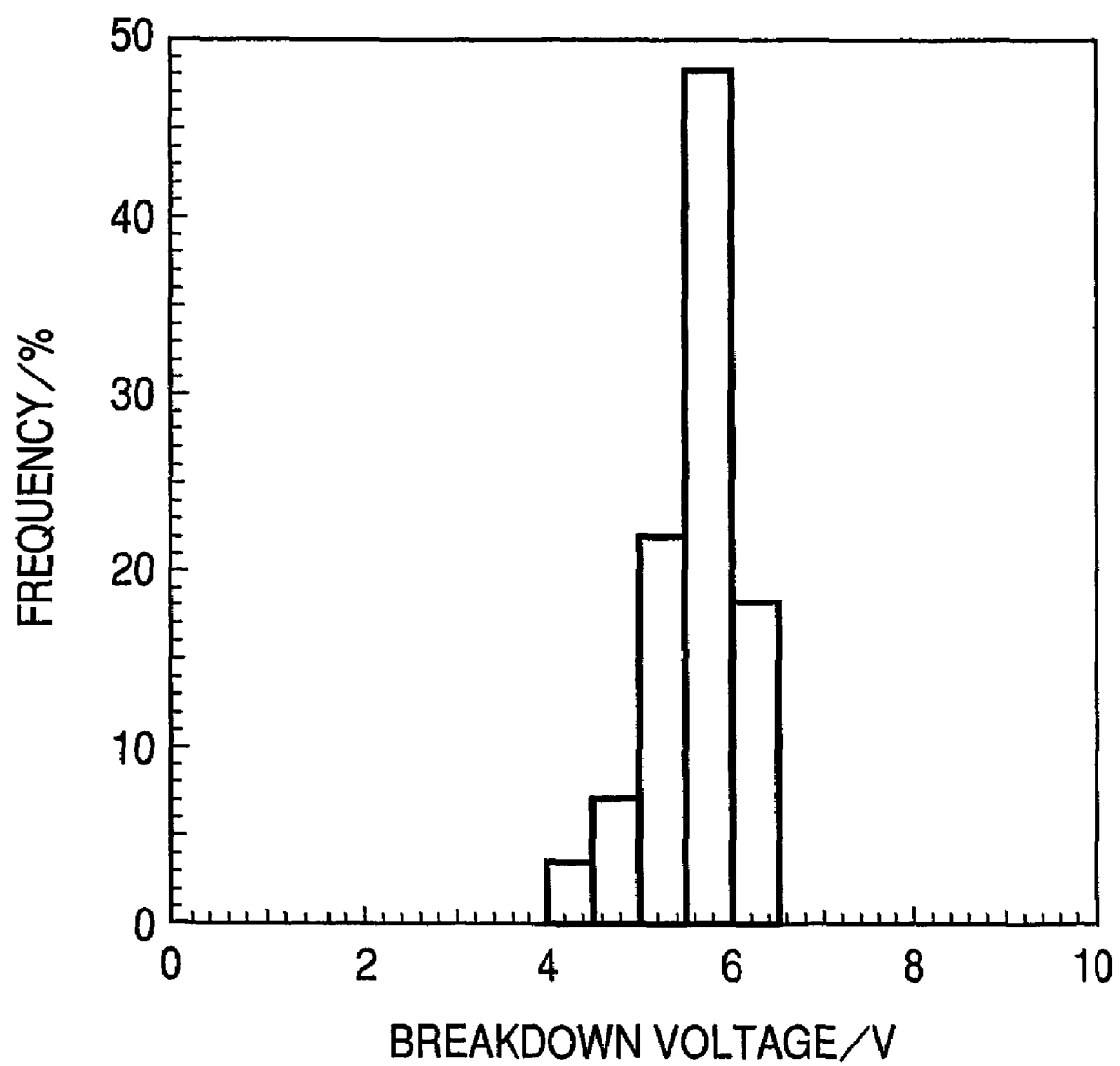
FIG. 3 is a histogram showing a breakdown voltage of the memory element.

Regarding the total of 16 memory elements R11 to R44, FIG. 3 shows an example of a histogram of a voltage causing breakdown as a threshold voltage value changing the impedance of the memory element. The breakdown voltage has a distribution from 4 V to 6.5 V. Therefore, it is understood that the memory array circuit constructed on the resin substrate can be driven at a write voltage having a lower limit of 6.5 V and at a read voltage having an upper limit of 4 V.

Figure 4:
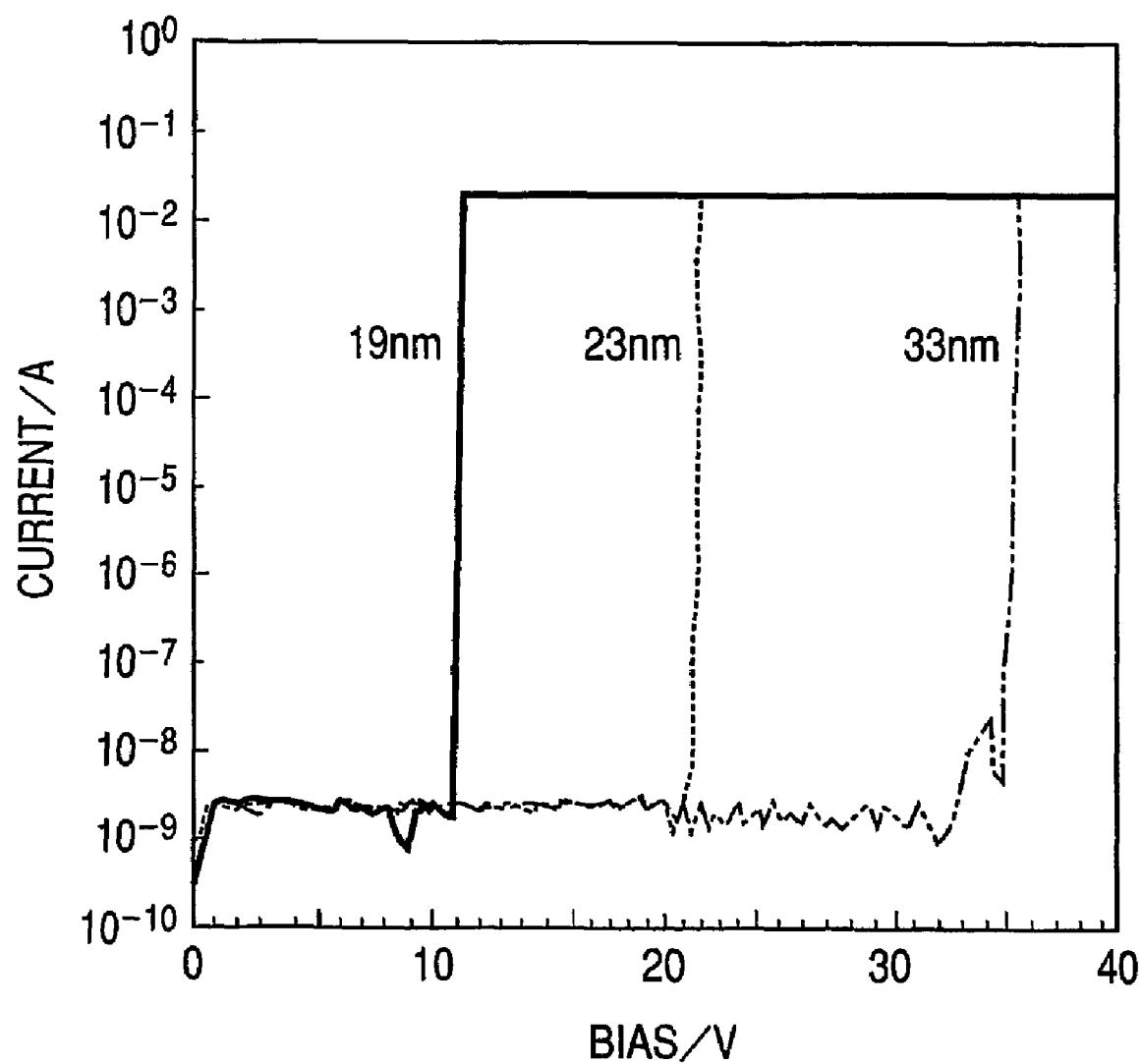
FIG. 4 is a graph showing current density/voltage characteristics of storage elements each having an alumina film with a different thickness.

Further, it is possible to set a thickness of the insulating film in accordance with a predetermined write operation voltage and a predetermined read operation voltage. For example, FIG. 4 is a graph of plotting applied voltage versus changed current when a thickness of the alumina film is set to 19 nm, 23 nm, and 33 nm, as an example. As is apparent from FIG. 4, as the film thickness is larger, the breakdown voltage is shifted on the higher voltage side, and as the film thickness is smaller, the breakdown voltage is shifted on the lower voltage side. Therefore, the film thickness is not limited to the above example.

Figure 5:
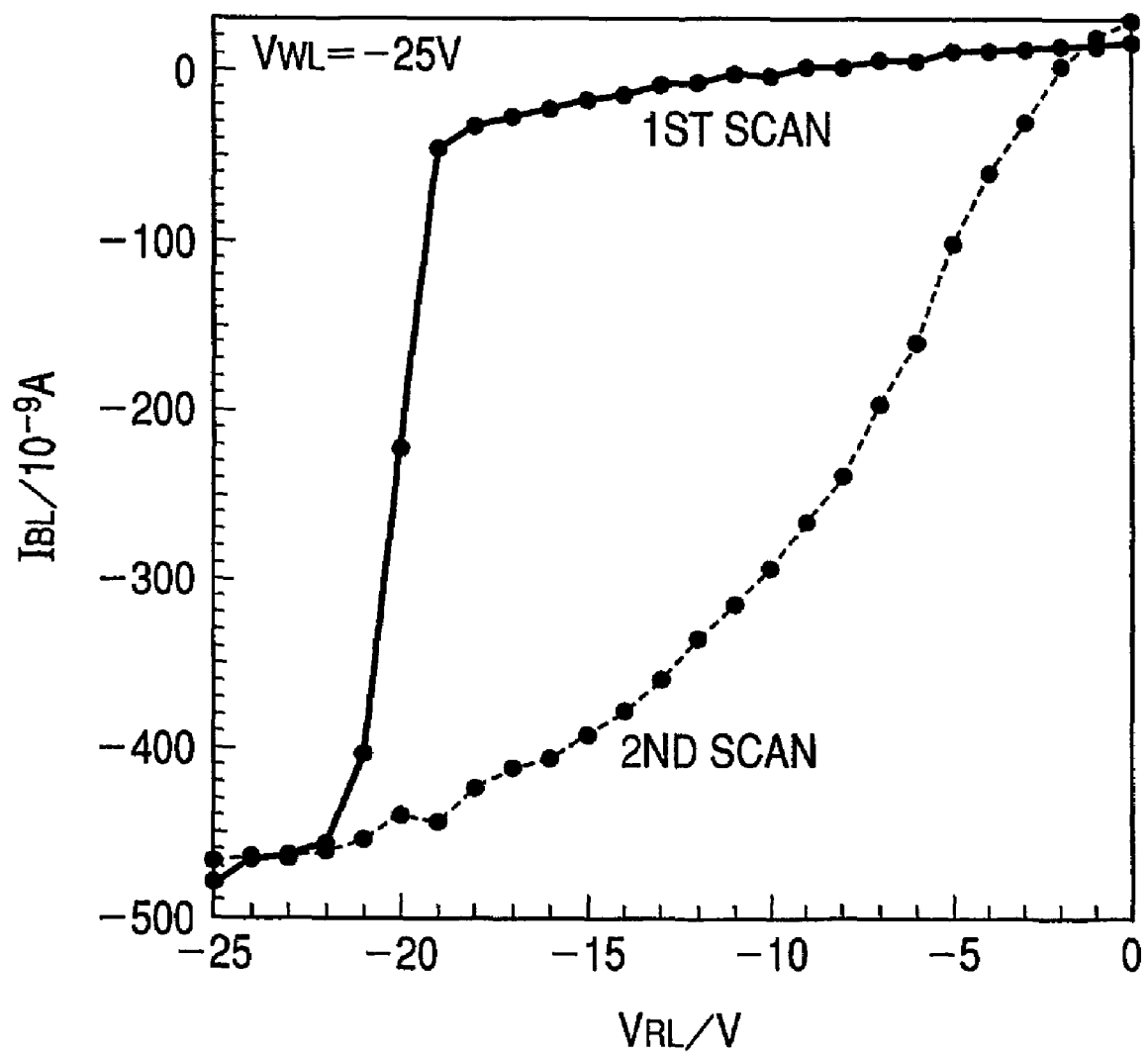
FIG. 5 is a graph showing a basic operation of a memory element in which an organic TFT and a storage element are connected to each other.

Regarding a cell obtained by forming the switching element, which is an organic TFT formed as a film by vacuum evaporation using pentacene as an organic semiconductor material in such a temperature range imparting no thermal damage to a resin substrate, and a memory element composed of a storage element having a dielectric made of alumina on a polyimide substrate, FIG. 5 is a graph showing an example of a basic operation of the cell. The horizontal axis represents a voltage of the bit line connected to the drain electrode of the TFT, and the vertical axis represents a current of the bit line. This example is obtained when the organic TFT is turned on by setting a voltage of the word line connected to the gate electrode to −25 V. When attention is paid to −10 V of the bit line for example, the current at the first scan before breakdown is 2.9 nA and the current at the second scan after the breakdown is 293 nA. Hence, it is confirmed that the current has the two states necessary for a memory operation. More specifically, the organic TFT and the dielectric formed on the resin substrate exert the basic operation of the memory element.

Next, a method for driving the memory device of the present invention will be described by way of example.

First, the read operation will be explained. Under the condition that each TFT acts as a p-channel voltage of −2 V is applied to a sense amplifier. Next, information in the cell C23 is read as follows. A voltage of −20 V is applied to the word line WL3, turning the selected transistor T23 on. Then, under the condition that an upper limit of an applied voltage is −4 V, a voltage is applied to the bit line BL2. At this moment, when C23 is selected and R23 is in a low-resistance state, the current flows from BL2 to T23 and to the ground, and the potential of the BL2 becomes close to the ground potential. Thus, the potential of the bit line BL2 becomes higher than the reference voltage and the sense amplifier SA2 outputs "1". On the other hand, when R23 is in a high-resistance state, the current hardly flows from BL2 to T23 and to the ground and the potential of BL2 becomes close to the power source potential. Thus, the potential of the bit line BL2 becomes lower than the reference voltage and the sense amplifier SA2 outputs "0".

Next, the write operation will be described. Under the condition that R23 is in a high-resistance state as the initial state, a voltage of −20 V is applied to the word line WL3 and the selected transistor T23 is turned on. Then, a voltage of −10 V is applied to the bit line BL2. At this point, C23 is selected and a voltage not lower than 5 V is applied to R23, thereby resulting in the fact that the state of R23 is irreversibly shifted to a low-resistance state. By this action, information is written into C23.

Such a nonvolatile memory device can be used as a memory for the conventional IC tag or IC card. In this way, it is possible to produce a low-priced IC tag or IC card. As an application, the device may be attached to a cartridge for an electrophotographic image forming apparatus such as a laser beam printer or a copying machine (i.e., a photosensitive drum or means for containing toner) or attached to a cartridge which contains ink for an ink jet printer using a piezoelectric system, or a Bubble Jet (registered trademark) system.

First Embodiment

Next, an experimental production processing for a memory device will be descried as an example of this embodiment. FIGS. 6 to 12 are schematic diagrams explaining production steps for the memory element according to this embodiment. Reference numeral 1 denotes a substrate, 2 denotes a contact, 3 denotes a word line lower electrode, 4 denotes a word line, 5 denotes a gate electrode, 6 denotes a plate line electrode, 7 denotes a bit line electrode, 8 denotes a memory element lower electrode, 9 denotes a gate insulating film, 10 denotes a dielectric film, 11 denotes a source electrode, 12 denotes a drain electrode, 13 denotes a memory element upper electrode, 14 denotes an organic semiconductor layer, 15 denotes a protective film, 16 denotes a bit line, and 17 denotes a plate line.

Figure 6:
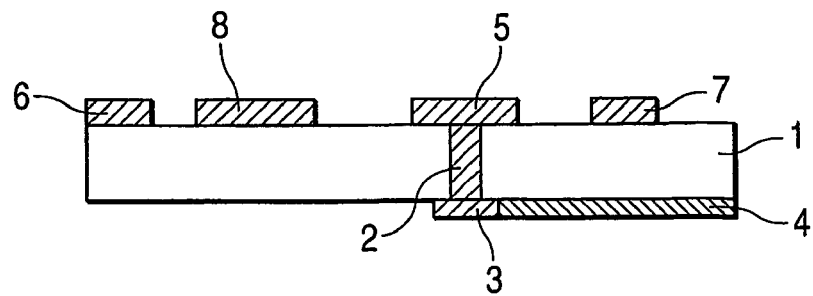
FIG. 6 is a cross-sectional view of a main part of a memory element and a transistor element according to a first embodiment of the present invention.
Figure 12:
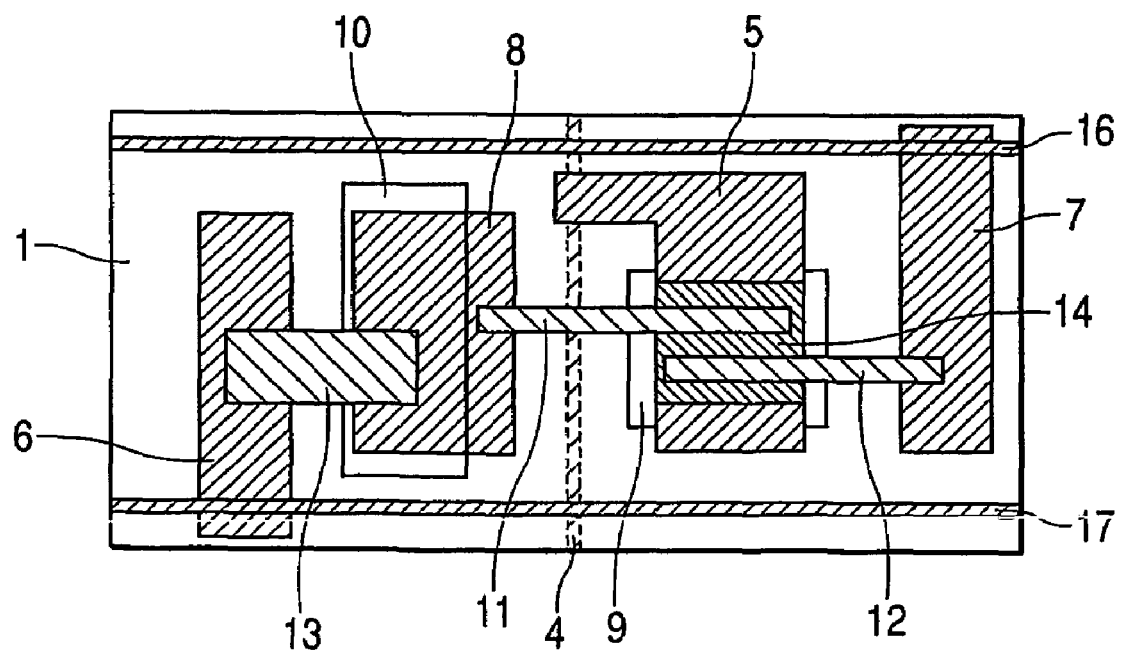
FIG. 12 is a top view of the memory element and the transistor element according to the first embodiment of the present invention.

First of all, the word line electrode 3, the word line 4, the gate electrode 5, the plate line electrode 6, the bit line electrode 7, and the memory element lower electrode 8 are formed by etching a copper foil on both surfaces (front and rear faces) of the substrate 1 made of polyimide resin as shown in FIG. 6, the bit line 16 and the plate line 17 are formed as shown in FIG. 12, and the contact 2 is formed by embedding plating copper in a through hole, whereby a substrate part is prepared. Herein, the gate electrode 5 is connected to the word line 4, the plate line electrode 6 is connected to the plate line 17, and the bit line electrode 7 is connected to the bit line 16.

Figure 7:
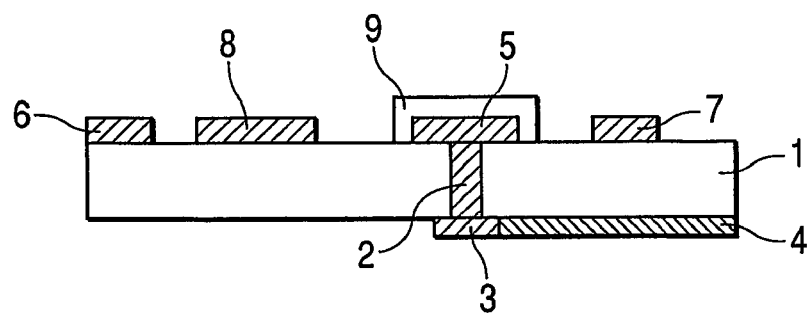
FIG. 7 is a cross-sectional view of the main part of the memory element and the transistor element according to the first embodiment of the present invention.

Next, as shown in FIG. 7, an alumina thin film is formed as the gate insulating film 9 by a sputtering method. The gate insulating film is selectively formed through a metal mask so as to cover the gate electrode 5.

Figure 8:
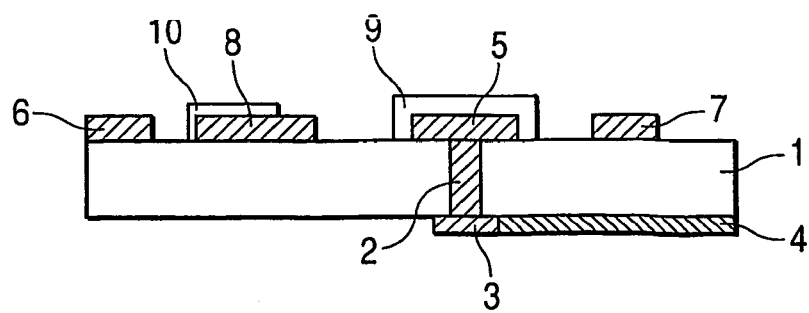
FIG. 8 is a cross-sectional view of the main part of the memory element and the transistor element according to the first embodiment of the present invention.

Then, as shown in FIG. 8, an alumina thin film is formed as the dielectric film 10 by the sputtering method. The dielectric film is selectively formed through a metal mask so as to cover the memory element lower electrode 8.

Figure 9:
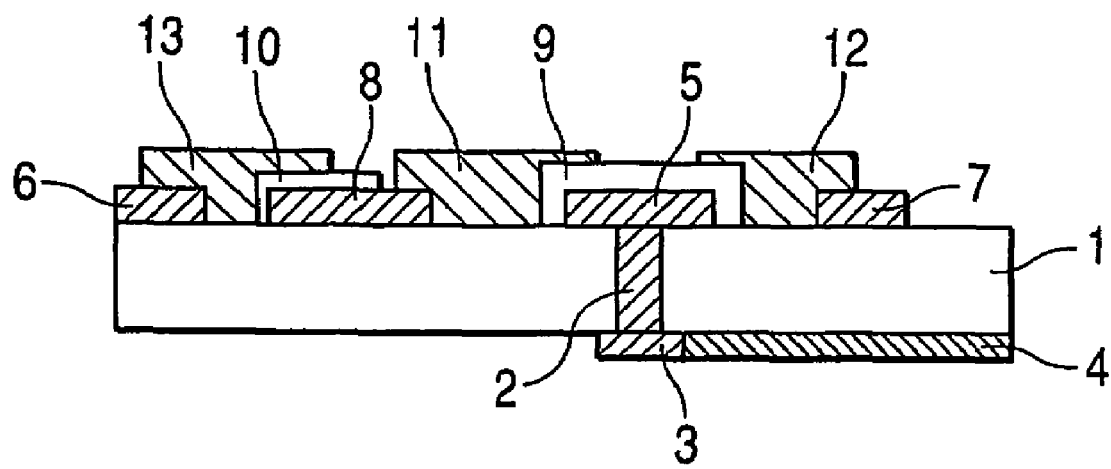
FIG. 9 is a cross-sectional view of the main part of the memory element and the transistor element according to the first embodiment of the present invention.

Subsequently, as shown in FIG. 9, silver electrodes are formed as the source electrode 11, the drain electrode 12, and the memory element upper electrode 13 by a screen printing method. At this time, the drain electrode 12 is connected to the bit line via the bit line electrode 7. Meanwhile, the source electrode 11 is connected to the memory element lower electrode 8. Further, the memory element upper electrode 13 is connected to the plate line 17 via the plate line electrode 6.

Figure 10:
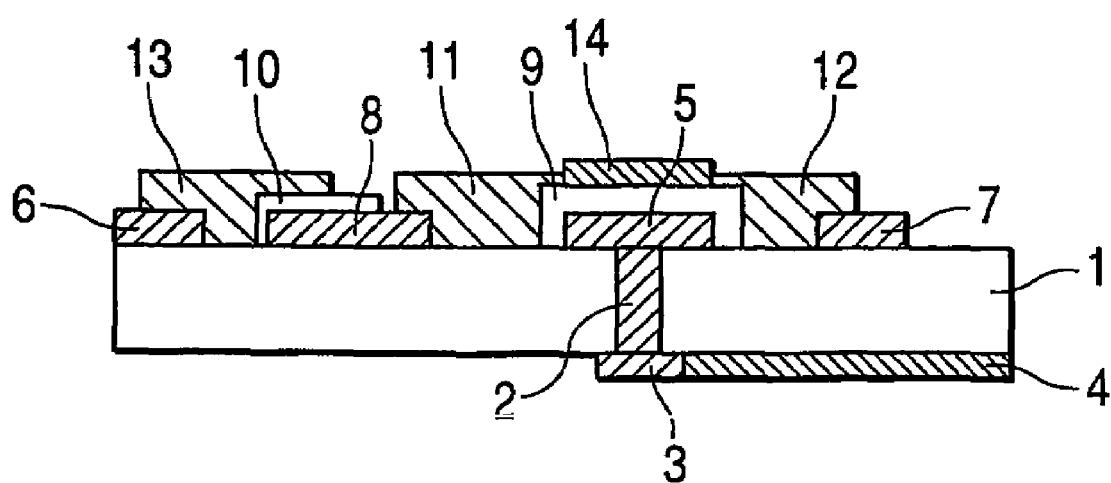
FIG. 10 is a cross-sectional view of the main part of the memory element and the transistor element according to the first embodiment of the present invention.
Figure 11:
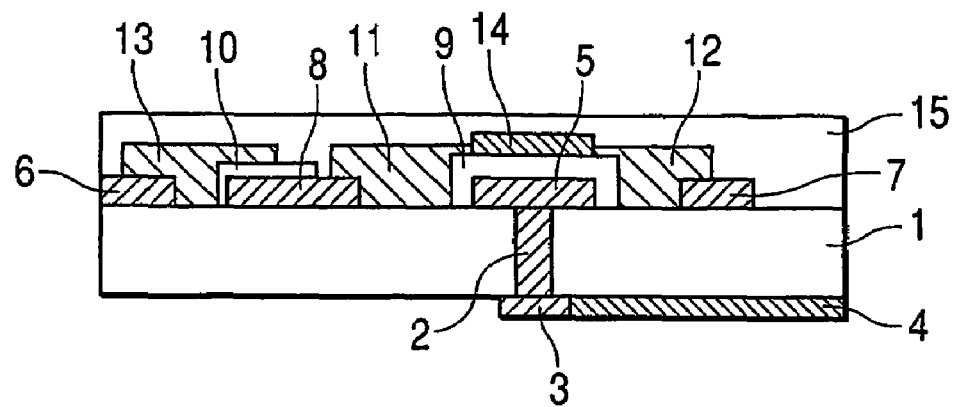
FIG. 11 is a cross-sectional view of the main part of the memory element and the transistor element according to the first embodiment of the present invention.

After that, as shown in FIG. 10, pentacene is subjected to vacuum evaporation for forming the organic semiconductor layer 14. Similarly to the gate insulating film 9, the organic semiconductor layer 14 is selectively formed through a metal mask on a region sandwiched by the source electrode 11 and the drain electrode 12 and on a region including a part of the respective electrodes, that is, formed so as to cover a region between the electrodes by means of. Next, a novolac resin is applied and cured as the protective film 15. As a result, the memory device including the organic TFT with an electrode arrangement called bottom contact type, and the memory element is formed on the resin substrate by the printing method.

Further, the same effects are also attained by using an organic TFT with an electrode arrangement called top contact type where the organic semiconductor layer 14 is selectively formed on the gate insulating film through a metal mask and thereafter the source electrode 11 and the drain electrode 12 are formed on the organic semiconductor layer, although not shown in the drawings.

Moreover, although not shown in the drawings, the bit line is connected to one terminal of the sense amplifier and outputs "0" when the bit line potential is lower than the reference potential comparing with the reference potential of the other terminal (low potential: a voltage close to the power source voltage), and outputs "1" when the bit line potential is higher than the reference potential (high potential: a voltage close to the ground voltage).

Driving of the thus fabricated memory device will be described on the precondition that a read operation voltage is −4 V and a write operation voltage is −10 V.

First, the read operation will be described. A voltage of −2 V is applied to the sense amplifier as the reference potential ("Ref." in FIG. 1). Next, an operation of reading the information in the cell C23 is conducted. A voltage of −20 V is applied to the word line WL3, and the selected transistor T23 is turned-on. Next, a voltage of −4 V is applied to the bit line BL2. At this moment, when C23 is selected and R23 is in a low-resistance state, the current flows from BL2 to T23, and to the ground, making the BL2 potential close to the ground potential. Therefore, the potential of the bit line BL2 becomes higher than the reference potential and the sense amplifier SA2 outputs "1". On the other hand, when R23 is in a high-resistance state, almost no current flows from BL2 to T23, and to the ground, and the potential of BL2 becomes close to the power source voltage. Therefore, the potential of the bit line BL2 becomes lower than the reference potential and the sense amplifier SA2 outputs "0".

Next, the write operation will be described. Under the condition that R23 is in a high-resistance state as the initial state, a voltage of −20 V is applied to the word line WL3 and selected transistor T23 is turned on. Then a voltage of −10 V is applied to the bit line BL2. At this moment, C23 is selected, a voltage not lower than 5 V is applied to R23, and the state of R23 is irreversibly shifted to a low-resistance state. By this operation, information is written into C23.

In the nonvolatile memory device according to this embodiment, a diode can be used as the switching element, and a junction type transistor can be used as the switching element.

Second Embodiment

Figure 13:
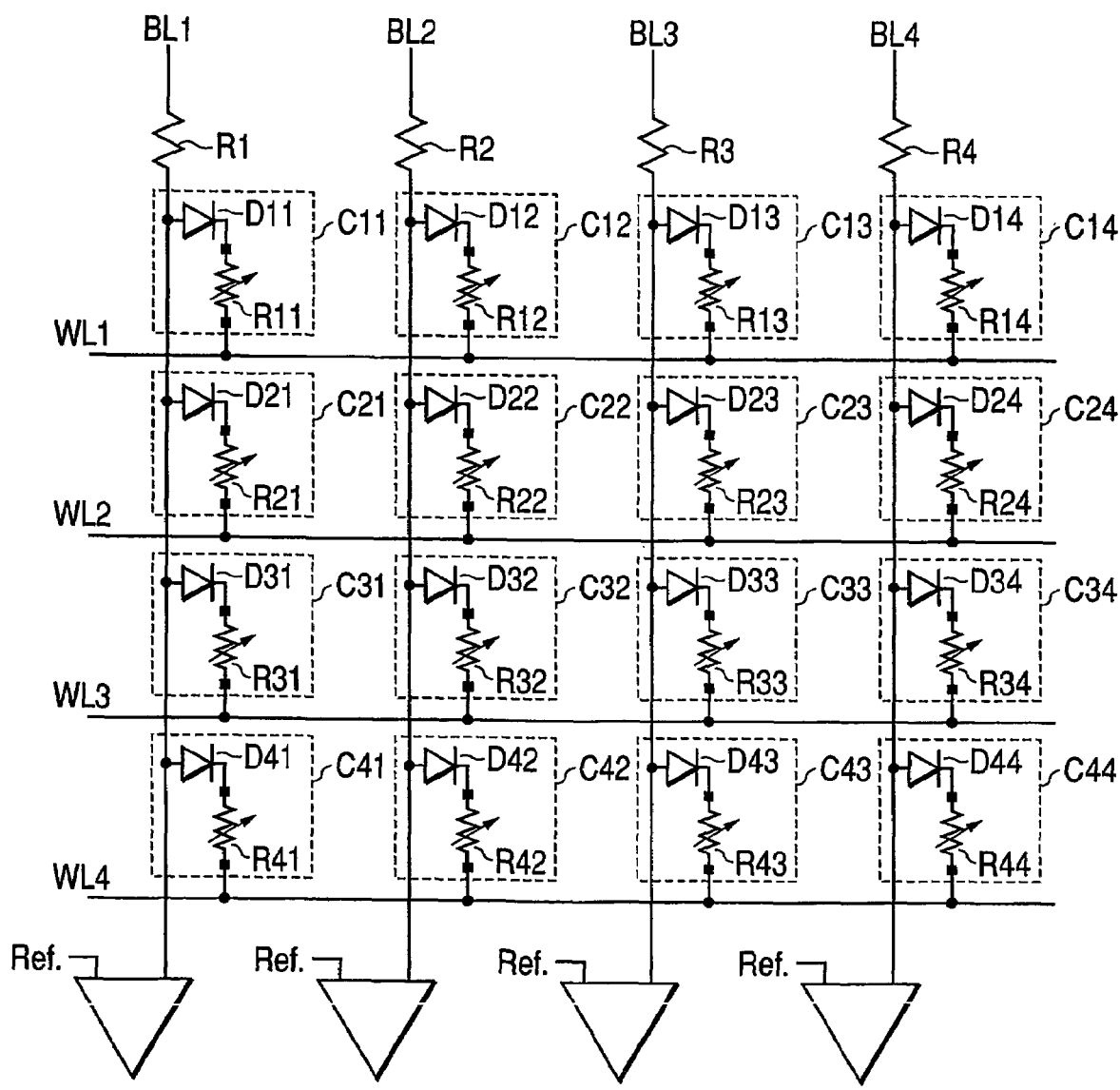
FIG. 13 is a circuit diagram illustrating a circuit configuration according to a second embodiment of the present invention.

In the nonvolatile memory device according to this embodiment, a diode can be used as the switching element. FIG. 13 shows an example of the configuration of this embodiment. In this embodiment, each cell has a switching element and a storage element similarly to the first embodiment. Each cell in the first embodiment has a transistor element as the switching element, while each cell in the second embodiment has a diode element as the switching element.

As shown in FIG. 13, the nonvolatile memory device of this embodiment has a plurality of such cells in the row and column directions (from C11 to C44). Taking one cell as an example, the cell C11 has a diode D11 and a memory element M11. One end of each memory element is connected to the diode of each cell, and the other end of each memory element is commonly connected to a word line WL. There are multiple word lines WL, and each of them is connected to a plurality of memory elements on a column-by-column base. One end of the diode that is not connected to the memory element is commonly connected to one of the bit lines BL. There are multiple bit lines BL and each of them is connected to one end of a plurality of diodes on a row-by-row base.

Next, the read operation will be described. For example, in selecting the cell C22, a constant voltage Vcc is applied to BL2 so that current flows to the grounded BL2 via the resistor R2. In this occasion, a voltage not lower than Vcc is applied to word lines WL other than WL2 so that no current flows into cells other than the selected one. At this moment, by comparing the potential of BL2 with the reference voltage Ref., it is possible to read information.

Next, the write operation will be described. For example, in selecting the cell C22, a constant voltage 2Vcc is applied to BL2 so that current flows to BL2 via R2. In this occasion, a voltage not lower than 2Vcc is applied to word lines WL other than WL2 so that no current flows into cells other than the selected one. By this, a large voltage is applied to the storage element D22 of the selected C22, thereby changing its impedance.

Third Embodiment

In this embodiment, similarly to the first embodiment, each cell has the switching element and the storage element. In the first embodiment, the storage element contains alumina as the dielectric formed by the sputtering method. In a third embodiment, polyimide which is a polymeric material is used as the dielectric. It is confirmed that the obtained memory device can be operated similarly to the first embodiment.

This application claims priority from Japanese Patent Application No. 2003-421309 filed Dec. 18, 2003, which is hereby incorporated by reference herein.

The invention claimed is:

1. A nonvolatile memory device comprising: a storage element; a switching element electrically connected to the storage element; and a plurality of lead wirings electrically connected to the switching element or the storage element, all of which are arranged on a resin substrate, wherein the switching element is an organic transistor having an active layer composed of an organic semiconductor, and wherein the storage element contains an insulating thin film and is a storage element for storing information by changing a high resistance state to a low resistance state under insulation breakdown caused by voltage application, an impedance of the storage element being irreversibly changed to the low impedance state by applying a write voltage higher than a read voltage to the storage element, and wherein the storage element is a storage element comprising a first electrode, an insulating thin film provided on the first electrode, and a second electrode provided on the insulating thin film, and wherein at least one of the first electrode and the second electrodes is formed in a print processing of screen printing, offset printing, or micro contact printing.

2. A nonvolatile memory device according to claim 1, wherein the insulating thin film is formed under a room temperature condition.

3. A nonvolatile memory device according to claim 1, wherein the switching element is an organic transistor including a source electrode, a drain electrode and a gate electrode, at least one of which is formed in a print processing of screen printing, offset printing, or micro contact printing.

4. A nonvolatile memory device comprising; a storage element; a switching element electrically connected to the storage element; and a plurality of lead wirings electrically connected to the switching element or the storage element, all of which are arranged on a resin substrate, wherein the switching element is an organic transistor having an active layer composed of an organic semiconductor, and wherein the storage element contains an insulating thin film and is a storage element for storing information by changing a high resistance state to a low resistance state under insulation breakdown caused by voltage application, an impedance of the storage element being irreversibly changed to the low impedance state by applying a write voltage higher than a read voltage to the storage element, and wherein the insulating thin film is a thin film made of aluminum oxide and the film has a thickness of 33 nm or less.

5. A nonvolatile memory device according to claim 4, wherein the switching element is an organic transistor including a source electrode, a drain electrode and a gate electrode, at least one of which is formed in a print processing of screen printing, offset printing, or micro contact printing.

6. A nonvolatile memory device according to claim 4, wherein the storage element is a storage element comprising a first electrode, an insulating thin film provided on the first electrode, and a second electrode provided on the insulating thin film, wherein at least one of the first electrode and the second electrodes is formed in a print processing of screen printing, offset printing, or micro contact printing.

7. A nonvolatile memory device according to claim 4, wherein the insulating thin film is formed under a room temperature condition.

8. A nonvolatile memory device comprising: a storage element; a switching element electrically connected to the storage element; and a plurality of lead wirings electrically connected to the switching element or the storage element, all of which are arranged on a resin substrate, wherein the switching element is an organic transistor having an active layer composed of an organic semiconductor, and which is formed without using an etching process, wherein the storage element contains an insulating thin film and is a storage element for storing information by changing a high resistance state to a low resistance state under insulation breakdown caused by voltage application, an impedance of the storage element being irreversibly changed to the low impedance state by applying a write voltage higher than a read voltage to the storage element, and wherein the insulating thin film is a thin film made of aluminum oxide and the film has a thickness of 33 nm or less.

9. A nonvolatile memory device according to claim 8, wherein the switching element is an organic transistor including a source electrode, a drain electrode and a gate electrode, at least one of which is formed in a print processing of screen printing, offset printing, or micro contact printing.

10. A nonvolatile memory device according to claim 8, wherein the insulating thin film is formed under a room temperature condition.

* * * * *

UNITED STATES PATENT AND TRADEMARK OFFICE
CERTIFICATE OF CORRECTION

PATENT NO.         : 7,359,230 B2
APPLICATION NO. : 10/546216
DATED                : April 15, 2008
INVENTOR(S)      : Sumida et al.

Page 1 of 1

It is certified that error appears in the above-identified patent and that said Letters Patent is hereby corrected as shown below:

<u>COLUMN 1</u>:
      Line 17, "transistors," should read -- transistor, --.

<u>COLUMN 9</u>:
      Line 10, "electrodes" should read -- electrode --.

<u>COLUMN 10</u>:
      Line 6, "electrodes" should read -- electrode --.

Signed and Sealed this

Second Day of September, 2008

JON W. DUDAS
*Director of the United States Patent and Trademark Office*